(12) United States Patent
Fang

(10) Patent No.: US 6,372,577 B1
(45) Date of Patent: Apr. 16, 2002

(54) CORE CELL STRUCTURE AND CORRESPONDING PROCESS FOR NAND TYPE PERFORMANCE FLASH MEMORY DEVICE

(75) Inventor: Hao Fang, Cupertino, CA (US)

(73) Assignee: Advanced Micro Devices, Inc., Sunnyvale, CA (US)

(*) Notice: Subject to any disclaimer, the term of this patent is extended or adjusted under 35 U.S.C. 154(b) by 0 days.

(21) Appl. No.: 09/443,647

(22) Filed: Nov. 18, 1999

Related U.S. Application Data

(62) Division of application No. 08/993,910, filed on Dec. 18, 1997, now Pat. No. 6,023,085.

(51) Int. Cl.$^7$ .......................................... H01L 21/8247
(52) U.S. Cl. ................................................ 438/258
(58) Field of Search ................................ 438/257–267

(56) References Cited

U.S. PATENT DOCUMENTS

| | | | |
|---|---|---|---|
| 4,823,175 A | | 4/1989 | Fontana |
| 4,833,096 A | * | 5/1989 | Huang et al. |
| 5,153,143 A | * | 10/1992 | Schlais et al. |
| 5,290,725 A | | 3/1994 | Tanaka et al. |
| 5,300,802 A | | 4/1994 | Komori et al. |
| 5,321,287 A | | 6/1994 | Uemura et al. |
| 5,508,957 A | | 4/1996 | Momodomi et al. |
| 5,574,685 A | | 11/1996 | Hsu |
| 5,668,034 A | | 9/1997 | Sery et al. |
| 5,824,583 A | * | 10/1998 | Asano et al. ............... 438/258 |
| 5,907,171 A | | 5/1999 | Santin et al. |
| 6,159,795 A | * | 12/2000 | Higashitani ............... 438/257 |
| 6,235,586 B1 | * | 5/2001 | Au et al. .................... 438/258 |
| 6,248,630 B1 | * | 6/2001 | Clementi et al. .......... 438/258 |

FOREIGN PATENT DOCUMENTS

| | | |
|---|---|---|
| JP | 6-151784 | 5/1994 |
| JP | 6-151871 | 5/1994 |

OTHER PUBLICATIONS

"A 4–Mb NAND EEPROM with Tight Programmed $V_t$ Distribution", Masaki Momodomi, Tomoharu Tanaka, Yoshihisa Iwata, Yoshiyuki Tanaka, Hideko Oodaira, Yasuo Itoh, Riichiro Shirota, Kazunori Ohuchi and Fujio Masuoka, *IEEE Journal of Solid–State Circuits*, vol. 26, No. 4, Apr., 1991.

* cited by examiner

Primary Examiner—Richard Booth
(74) Attorney, Agent, or Firm—Eschweiler & Associates, LLC

(57) ABSTRACT

A method of forming a NAND-type flash memory device (200) includes forming a stacked gate flash memory structure (346) for one or more flash memory cells in a core region (305) and forming a transistor structure having a first gate oxide (336) and a gate conductor (338) for both a select gate transistor (344) in the core region (305) and a low voltage transistor (342) in a periphery region (328). In addition, a NAND-type flash memory device (200) includes a core region (305) comprising a stacked gate flash memory cell structure (346) and a select gate transistor (344) and a periphery region (328, 332) comprising a low voltage transistor (342) and a high voltage transistor (350), wherein a structure of the select gate transistor (344) and the low voltage transistor (342) are substantially the same.

9 Claims, 10 Drawing Sheets

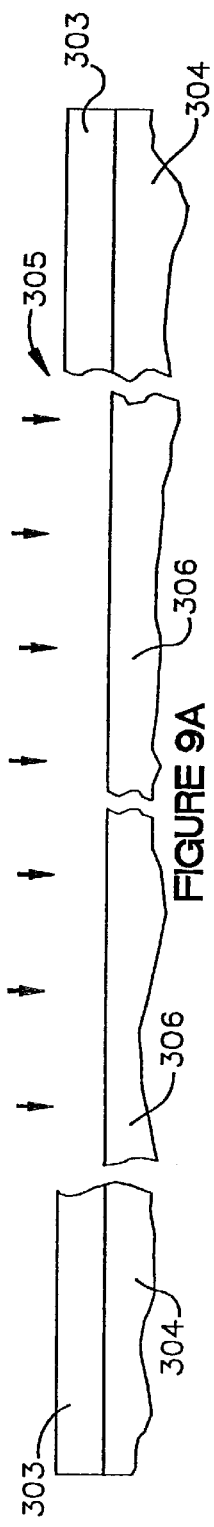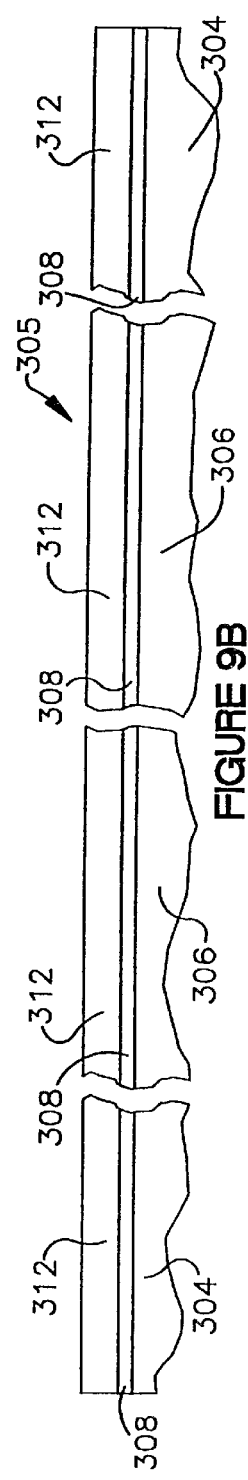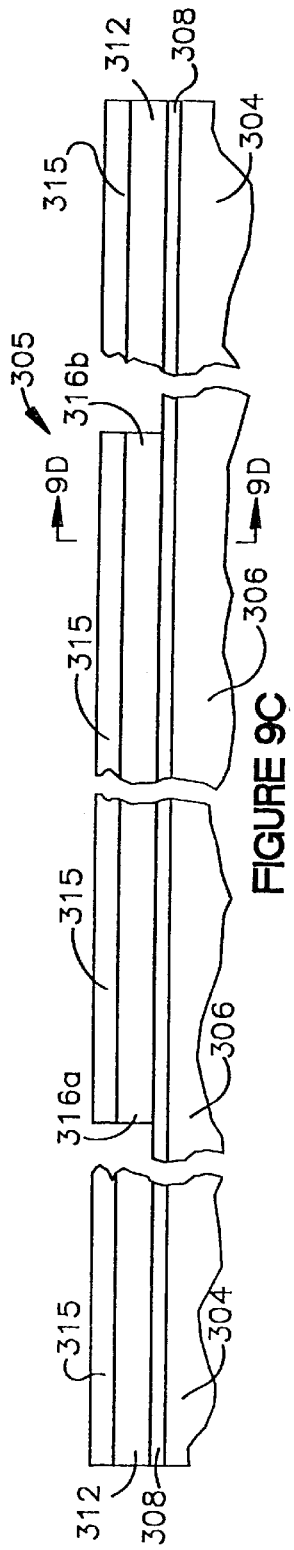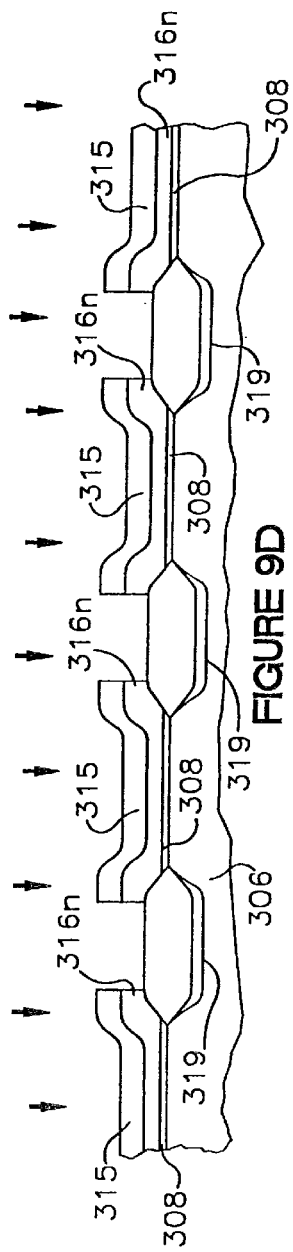

CORE CELL STRUCTURE AND CORRESPONDING PROCESS FOR NAND TYPE PERFORMANCE FLASH MEMORY DEVICE

RELATED APPLICATION

This application is a divisional of Ser. No. 08/993,910 filed Dec. 18, 1997 now U.S. Pat. No. 6,023,085, which is entitled "Core Cell Structure and Corresponding Process for NAND Type High Performance Flash Memory Device".

FIELD OF THE INVENTION

The present invention generally relates to integrated circuits and, in particular, to a flash memory structure and a method of flash memory fabrication wherein a new core cell structure eliminates a stacked gate structure for the select gate transistors while eliminating a core dual oxide manufacturing step. The elimination of the core dual oxide step substantially simplifies the process, eliminates associated tunnel oxide reliability concerns and shrinks the size of the select gate transistor by eliminating the need for a poly1 contact.

BACKGROUND OF THE INVENTION

Semiconductor devices typically include multiple individual components formed on or within a substrate. Such devices often comprise a high density section and a low density section. For example, as illustrated in prior art FIG. 1a, a memory device such as a flash memory 10 comprises one or more high density core regions 11 and a low density peripheral portion 12 on a single substrate 13. The high density core regions 11 typically consist of at least one M×N array of individually addressable, substantially identical floating-gate type memory cells and the low density peripheral portion 12 typically includes input/output (I/O) circuitry and circuitry for selectively addressing the individual cells (such as decoders for connecting the source, gate and drain of selected cells to predetermined voltages or impedances to effect designated operations of the cell such as programming, reading or erasing).

The memory cells within the core portion 11 are coupled together in a NAND-type circuit configuration, such as, for example, the configuration illustrated in prior art FIG. 1b. Each memory cell 14 has a drain 14a, a source 14b and a stacked gate 14c. A plurality of memory cells 14 connected together in series with a drain select transistor at one end and a source select transistor at the other end to form a NAND string as illustrated in prior art FIG. 1b. Each stacked gate 14c is coupled to a word line (WL0, W1, . . . , WLn) while each drain of the drain select transistors are coupled to a bit line (BL0, BL1, . . . , BLn). Lastly, each source of the source select transistors are coupled to a common source line Vss. Using peripheral decoder and control circuitry, each memory cell 14 can be addressed for programming, reading or erasing functions.

Prior art FIG. 1c represents a fragmentary cross section diagram of a typical memory cell 14 in the core region 11 of prior art FIGS. 1a and 1b. Such a cell 14 typically includes the source 14b, the drain 14a and a channel 15 in a substrate or P-well 16; and the stacked gate structure 14c overlying the channel 15. The stacked gate 14c further includes a thin gate dielectric layer 17a (commonly referred to as the tunnel oxide) formed on the surface of the P-well 16. The stacked gate 14c also includes a polysilicon floating gate 17b which overlies the tunnel oxide 17a and an interpoly dielectric layer 17c overlies the floating gate 17b. The interpoly dielectric layer 17c is often a multilayer insulator such as an oxide-nitride-oxide (ONO) layer having two oxide layers sandwiching a nitride layer Lastly, a polysilicon control gate 17d overlies the interpoly dielectric layer 17c. The control gates 17d of the respective cells 14 that are formed in a lateral row share a common word line (WL) associated with the row of cells (see, e.g., prior art FIG. 1b). In addition, as highlighted above, the drain regions 14a of the respective cells in a vertical column are connected together by a conductive bit line (BL). The channel 15 of the cell 14 conducts current between the source 14b and the drain 14a in accordance with an electric field developed in the channel 15 by the stacked gate structure 14c.

According to conventional operation, the flash memory cell 14 operates in the following manner. The cell 14 is programmed by applying a relatively high voltage $V_G$ (e.g., approximately 18 volts) to the control gate 17d and connecting the drain, source and P-well to ground. A resulting high electric field across the tunnel oxide 17a leads to a phenomena called "Fowler-Nordheim" tunneling. During this process, electrons in the core cell channel region tunnel through the gate oxide into the floating gate 17b and become trapped in the floating gate 17b since the floating gate 17b is surrounded by insulators (the interpoly dielectric 17c and the tunnel oxide 17a). As a result of the trapped electrons, the threshold voltage of the cell 14 increases by about 3 to 5 volts. This change in the threshold voltage (and thereby the channel conductance) of the cell 14 created by the trapped electrons is what causes the cell to be programmed.

To read the memory cell 14, a predetermined voltage $V_G$ that is greater than the threshold voltage of an erased cell, but less than the threshold voltage of a programmed cell, is applied to the control gate 17d with a voltage applied between the source 14b and the drain 14a. If the cell 14 conducts, then the cell 14 has not been programmed (the cell 14 is therefore at a first logic state, e.g., a zero "0"). Likewise, if the cell 14 does not conduct, then the cell 14 has been programmed (the cell 14 is therefore at a second logic state, e.g., a one "1"). Consequently, one can read each cell 14 to determine whether it has been programmed (and therefore identify its logic state).

In order to erase the flash memory cell 14, a relatively high voltage $V_S$ (e.g., approximately 20 volts) is applied to the P-well 16 and the control gate 17d is held at a ground potential ($V_G$=0), while the drain 14a and the source 14b are allowed to float. Under these conditions, a strong electric field is developed across the tunnel oxide 17a between the floating gate 17b and the P-well 16. The electrons that are trapped in the floating gate 17b flow toward and cluster at the portion of the floating gate 17b overlying the source region 14b and are extracted from the floating gate 17b and into the source region 14b by way of Fowler-Nordheim tunneling through the tunnel oxide 17a. Consequently, as the electrons are removed from the floating gate 17b, the cell 14 is erased.

There is a strong need in the art for a flash memory device structure and process for manufacture that improves the performance and reliability of the device while simplifying its method of manufacture.

SUMMARY OF THE INVENTION

The present invention relates to flash memory device structure and a method for its manufacture. In a core portion of a NAND-type flash memory cell, a select gate transistor structure has a structure like that of the periphery low voltage transistor and is fabricated using essentially the same steps as those used in fabricating the periphery low voltage transistor. The select gate transistor structure allows the device to be easily fabricated by eliminating the dual core oxide formation process. Elimination of the dual core oxide process steps reduces the number of process steps and prevents a source of potential contamination prior to the formation of the core tunnel oxide, thereby improving the reliability of the device.

According to another aspect of the present invention, the formation of a select gate transistor structure like that of the periphery low voltage transistor eliminates the stacked gate structure for the select gate transistors and the need for a poly1 contact to short out the poly1 and poly2 layers, thereby advantageously reducing the die area. In addition, eliminating the stacked gate structure for the select gate transistor allows for a channel stop implant to be performed in the select gate transistor region, thereby improving the bit line isolation and decreasing the potential for bit line to bit line punch through.

To the accomplishment of the foregoing and related ends, the invention comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

BRIEF DESCRIPTION OF THE DRAWINGS

FIG. 2b is a plan layout view of the core portion of the NAND-type flash memory device of FIG. 2a;

FIGS. 9a–9h are cross section diagrams illustrating the various steps in the manufacturing process of FIG. 8 according to the present invention.

DETAILED DESCRIPTION OF THE INVENTION

Figure 1A:
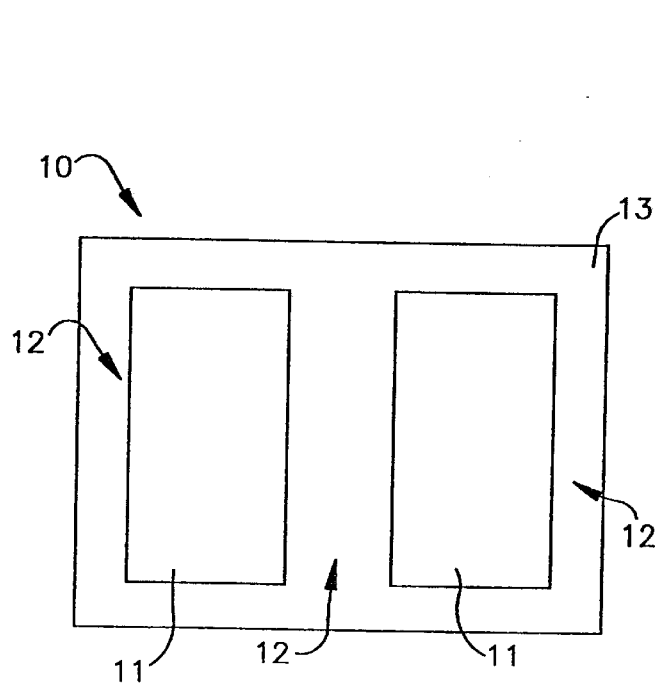
FIG. 1a is a plan view illustrating a prior art layout of a flash memory chip.

The present invention will now be described with reference to the drawings wherein like reference numerals are used to refer to like elements throughout. The present invention relates to a flash memory device and a method for its manufacture that, according to one aspect of the present invention, eliminates the dual core oxide processing steps by replacing the stacked gate transistor structure with a transistor structure that resembles a conventional periphery low voltage transistor. Consequently, the steps used in forming the periphery low voltage transistors may be used to construct the core select gate transistors, thereby substantially reducing the number of processing steps needed to construct the flash memory device.

According to another aspect of the present invention, elimination of the dual core oxide processing steps advantageously improves the manufacturability of the process by eliminating a source of potential tunnel oxide contamination and thereby improving the tunnel oxide integrity in the core flash memory cell region. The present invention also provides for a reduction in the size of the core portion of the device since the new select gate transistor structure is not a stacked gate structure. Consequently, a poly1 contact is not required to short out the poly1 and poly2 layers. Eliminating the poly1 contact reduces the size of each select gate transistor. Eliminating the need for a poly1 contact also allows for the elimination of subsequent processing needed to create the poly1 contact.

According to yet another aspect of the present invention, elimination of the stacked gate structure for the select gate transistors in the core region allows for a channel stop implant to be performed in the select gate transistor regions which improves bit line isolation and substantially reduces the potential for bit line to bit line punch through, thereby improving the reliability of the flash memory device.

Figure 2A:
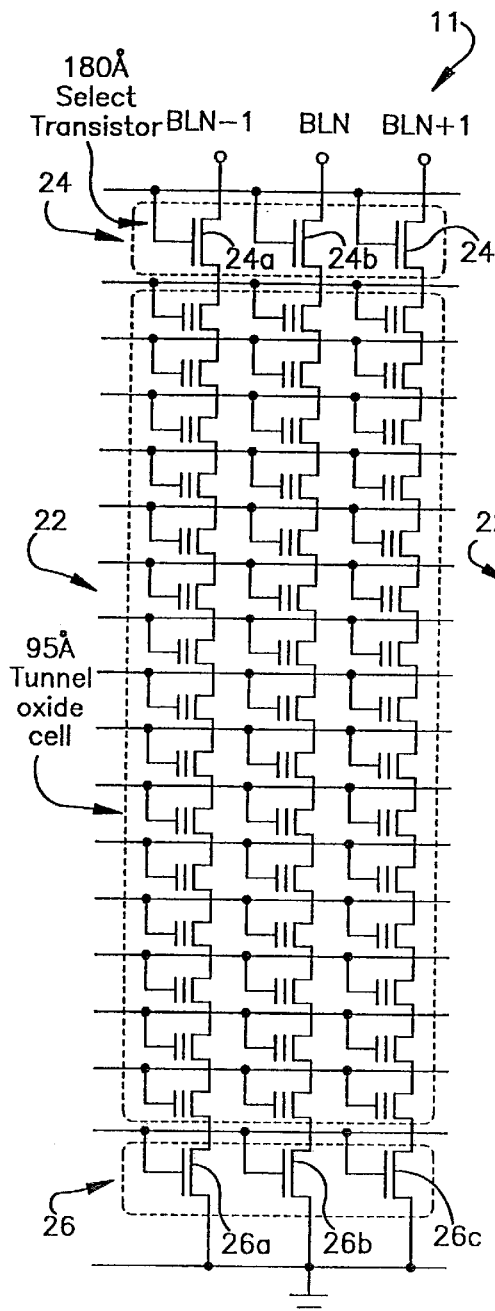
FIG. 2a is a schematic diagram illustrating a core portion of a NAND-type flash memory device.

The present invention may best be understood and its advantages appreciated in conjunction with the core structure and process of FIGS. 2a–5k. A circuit schematic diagram illustrating a core portion 11 of a NAND-type flash memory device is illustrated in FIG. 2a. The core portion 11 includes a memory cell region 22 which is bounded on one side by a drain select transistor portion 24 and bounded on another side by a source select transistor portion 26. Each of the select transistor portions 24 and 26 contain select gate transistors 24a–24c and 26a–26c, respectively, which operate to selectively activate a desired bit line (e.g.,BLN−1, BLN, BLN+1) by ensuring the selectivity of each bit line and preventing the cell current from conducting current through the bit line during a programming operation as is well known by those skilled in the art.

Figure 1C:
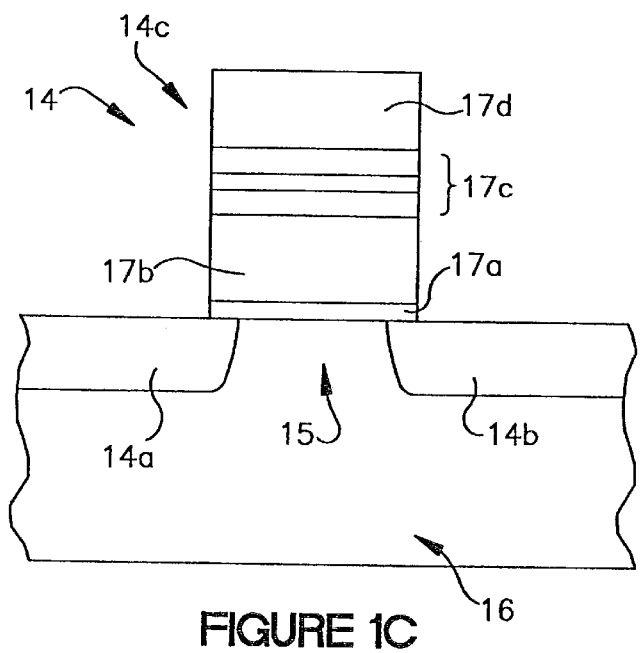
FIG. 1c is a fragmentary cross section illustrating a prior art stacked gate flash memory cell.
Figure 1B:
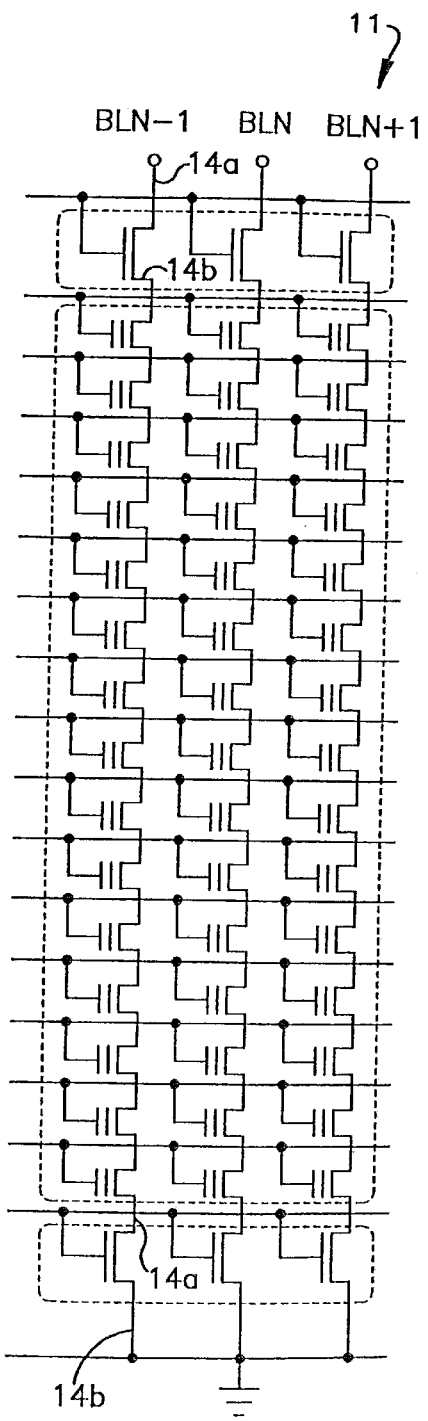
FIG. 1b is a schematic diagram illustrating a prior art NAND-type flash memory circuit configuration.
Figure 2B:
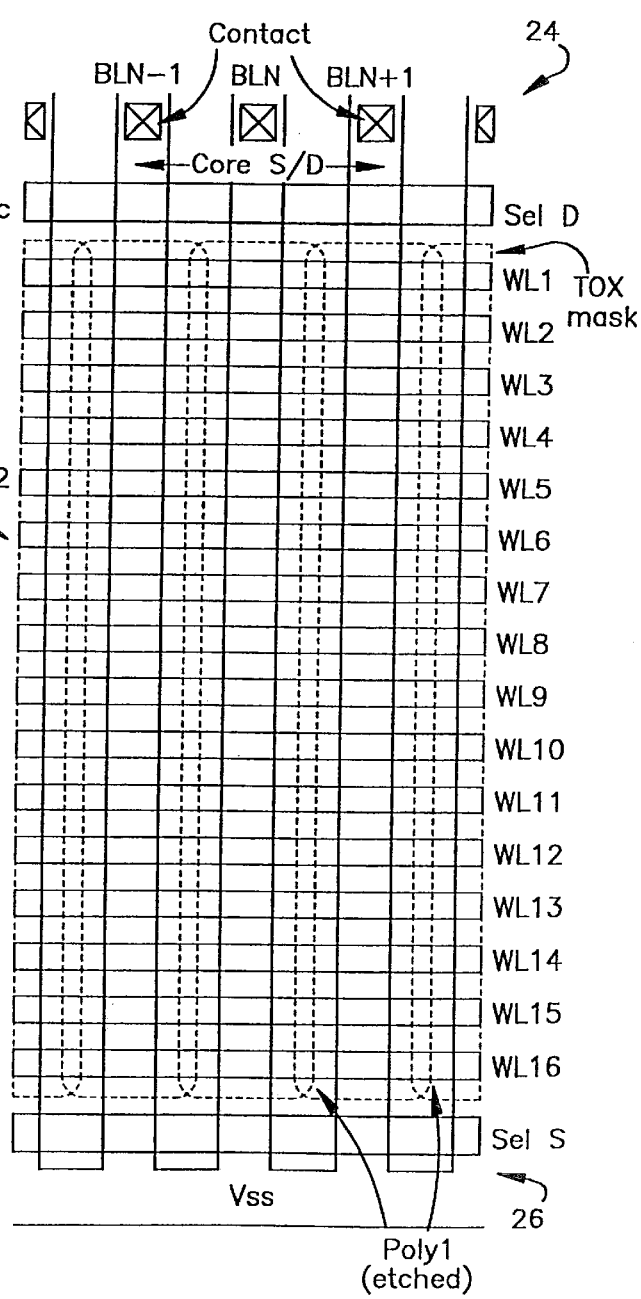

In the NAND-type flash memory process which forms the core circuit 12 of FIG. 2a and its corresponding circuit layout (of which FIG. 2b is a plan view), a dual core cell oxide process is used to form the memory cell oxides and the select gate transistor oxides, respectively (since the memory cell oxides and select gate transistor oxides have different thicknesses). In addition, a dual periphery gate oxide process for formation of the high and low voltage transistors in the periphery region 14 (see, e.g., FIG. 1) is also utilized. The process further includes a double polysilicon layer formation layer to generate the stacked gate structures in the core region 12.

The core select gate transistors 24a–24c and 26a–26c are similar in structure to the stacked gate flash memory structures in the memory cell region 22 except that their gate oxide is approximately twice as thick as the cell oxide (also called the tunnel oxide) in the stacked gate structure of the memory cell (about 180 Å compared to about 95 Å). The select transistors 24a–24c utilize a gate oxide of 180 Å to improve the reliability of the transistors by reducing the vulnerability of the devices to band to band tunneling induced hot carrier stress during programming. The select gate transistors 24a–24c and 26a–26c further differ from the stacked gate flash memory cell structures of the region 22 because they operate as conventional MOS transistors and therefore have the first and second polysilicon layer shorted together to simulate a standard MOS transistor configuration. A plan circuit layout view of the conventional NAND-type circuit arrangement 12 is illustrated in FIG. 2b.

The dual core oxides (the tunnel oxide and the select gate oxide) are created by growing a first gate oxide of approximately 140 Å and then using a mask to open a space for etching to thereby define a tunnel oxide region. Subsequent the etching, another oxide is grown to form the tunnel oxide of about 95 Å in the previously etched region while the unetched select gate oxide region continues to grow to a thickness of about 180 Å.

Similarly, the dual periphery gate oxides are later formed in a dual oxide process that includes growing an initial gate oxide of about 285 Å and then using a mask to define for etching a thin low voltage transistor gate oxide region. Subsequent the etching, another oxide is grown to generate a 160 Å low voltage transistor oxide in the previously etched region while the unetched high voltage transistor oxide region continues to grow to a thickness of about 400 Å.

Figure 3A:
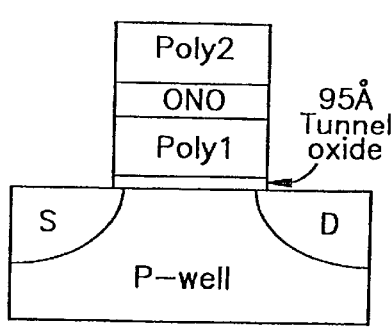
FIG. 3a is a cross section of a stacked gate flash memory cell.
Figure 3B:
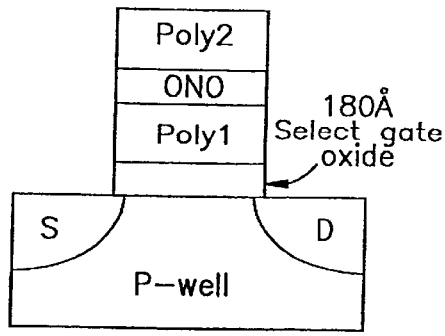
FIG. 3b is a cross section of a select gate transistor having a stacked gate structure, wherein the poly1 and poly2 layers are shorted together.
Figure 3C:
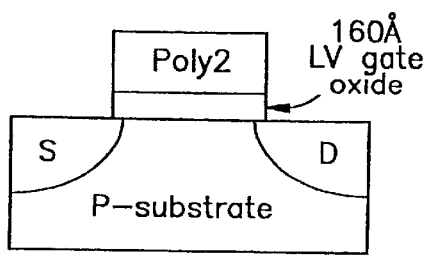
FIG. 3c is a cross section of a periphery low voltage transistor.
Figure 3D:
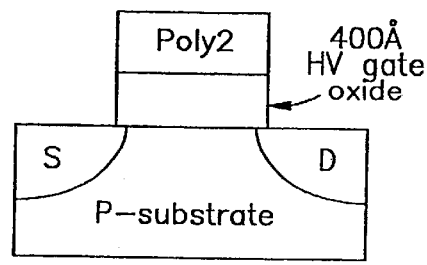
FIG. 3d is a cross section of a periphery high voltage transistor;.

In the above process, the first polysilicon layer (poly1) is used as the floating gate region for the core memory cells and the second polysilicon layer (poly2) is used for both the core memory cell control gates and the gate regions for the periphery transistors (both high and low voltage). Consequently, the NAND-type process involves the fabrication of four types of devices, as illustrated in FIGS. 3a–3d, wherein FIG. 3a is a cross section of a stacked gate memory cell in the core memory cell region 22, FIG. 3b is a cross section of a select gate transistor in the select gate regions 24 and 26 (wherein the poly1 and poly2 layers are shorted together), FIG. 3c is a cross section of a periphery low voltage transistor and FIG. 3d is a cross section of a periphery high voltage transistor.

Figure 4:
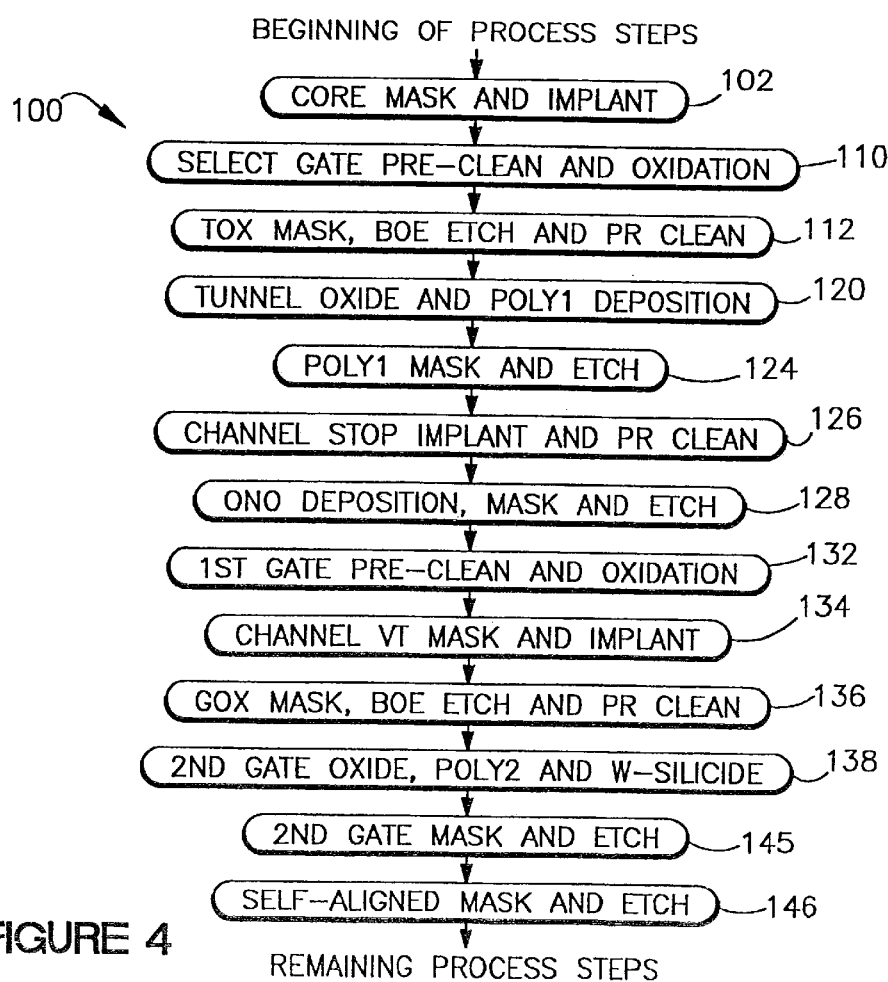
FIG. 4 is a flow chart diagram illustrating a semiconductor manufacturing process flow for forming the NAND-type flash memory device of FIGS. 2a and 2b.
Figure 5A:
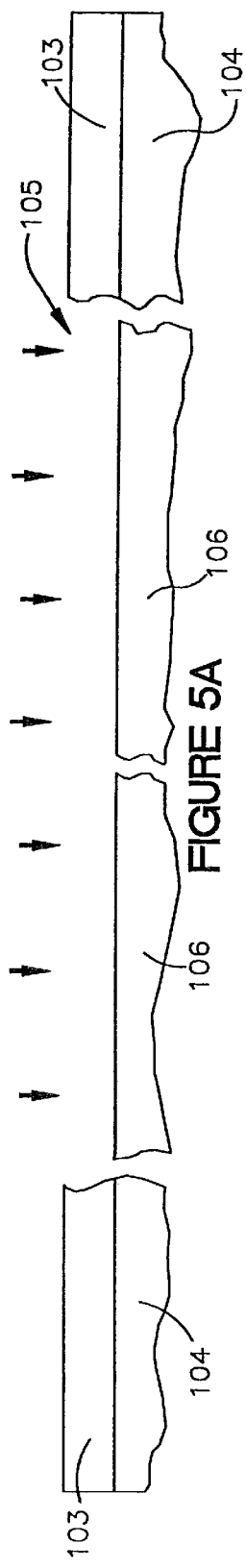
FIGS. 5a–5l are cross section diagrams illustrating the various steps in the manufacturing process of FIG. 4.

A semiconductor manufacturing process flow illustrating the NAND-type flash memory device process 100 is illustrated in FIG. 4 and will be discussed in detail in conjunction with FIGS. 5a–5l. The process 100 begins with a core mask and core Vt (threshold voltage) implant step 102 wherein a photoresist mask 103 is formed and patterned over a P-well which resides in an N-well which resides in a P-substrate 104 to define an opening over a core region 105. The core region 105 is then subjected to a P-type impurity dopant via, for example, ion implantation to thereby form a highly doped channel region 106 in the P-well of the core region 105, as illustrated in FIG. 5a.

Figure 5B:
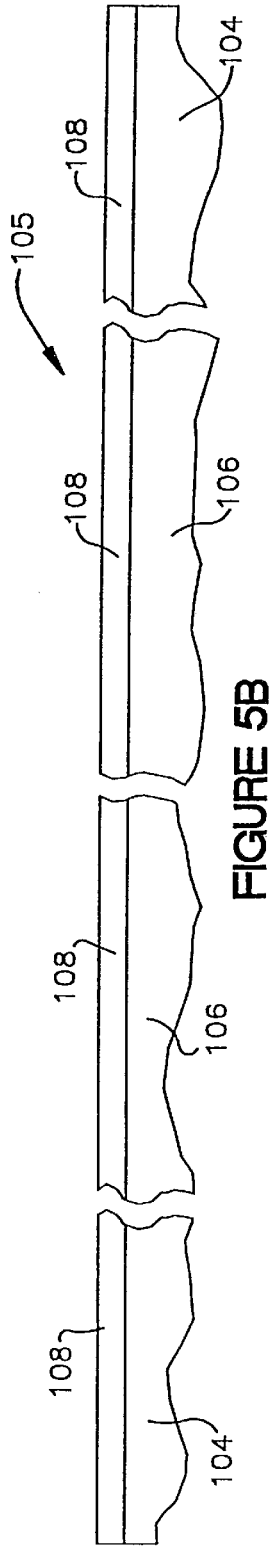
Figure 5C:
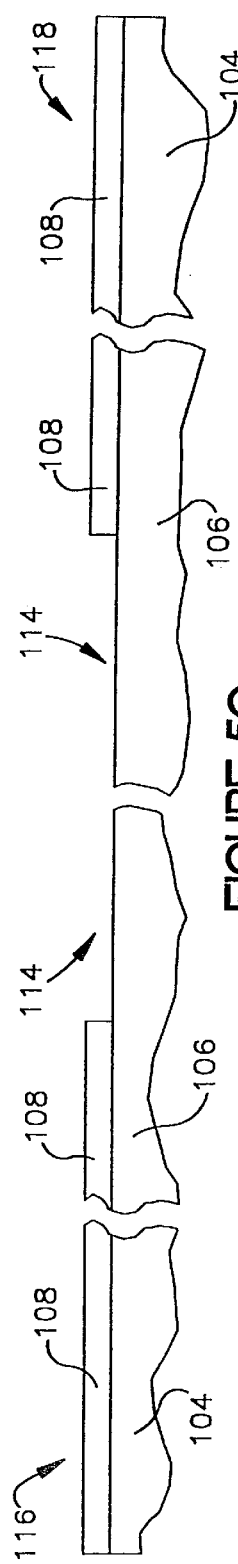

The photoresist mask 103 is then removed, a select gate pre-clean is performed and an oxide layer 108 is formed over the surface of the device at step 110, as illustrated in FIG. 5b. A tunnel oxide mask (TOX) (not shown) is then formed at step 112 to define an area 114 within the core region 105 in which the tunnel oxide for the core memory cells will be formed. An etch step follows to remove the oxide layer 108 in the region 114 exposed by the TOX mask but not in the peripheral regions 116 and 118, respectively, as illustrated in FIG. 5c. Step 112 continues with a photoresist clean to remove the TOX mask.

Once the cleaning is complete, a tunnel oxide 119 having a thickness of about 95 Å is grown in the region 114 at step 120. At the same time, the second oxidation step causes the oxide layer 108 to increase to about 180 Å. Therefore steps 110, 112 and 120 constitute the core dual oxide processing steps to form a memory cell tunnel oxide of about 95 Å and a select gate transistor gate oxide of about 180 Å in the core region 105.

Figure 5D:
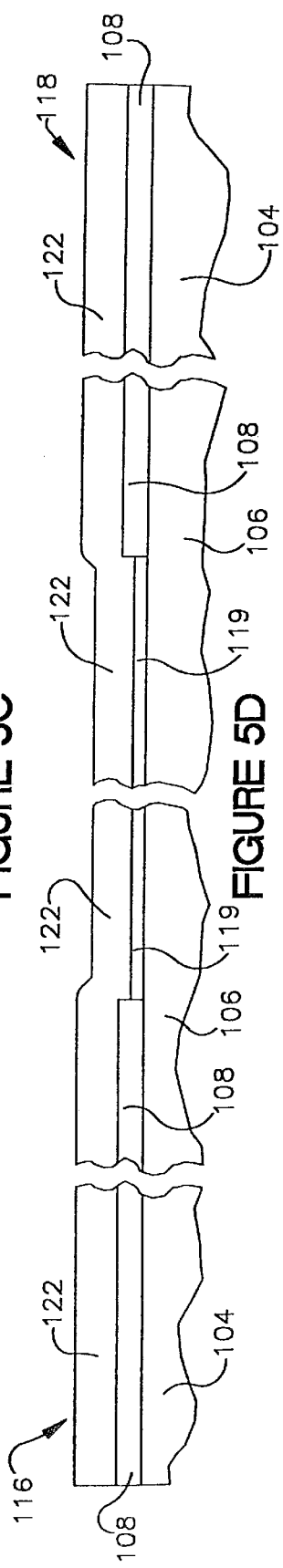
Figure 5E:
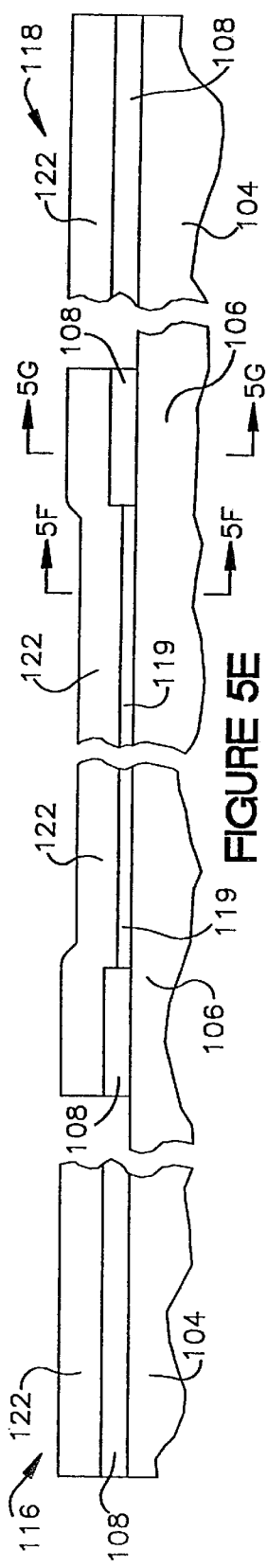
Figure 5F:
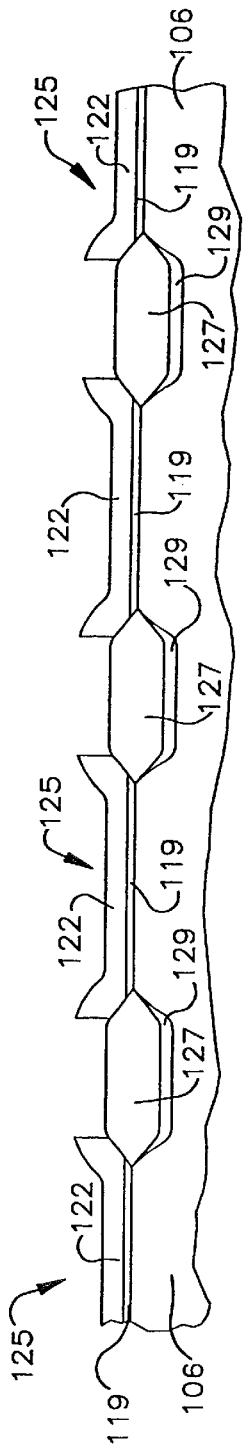
Figure 5G:
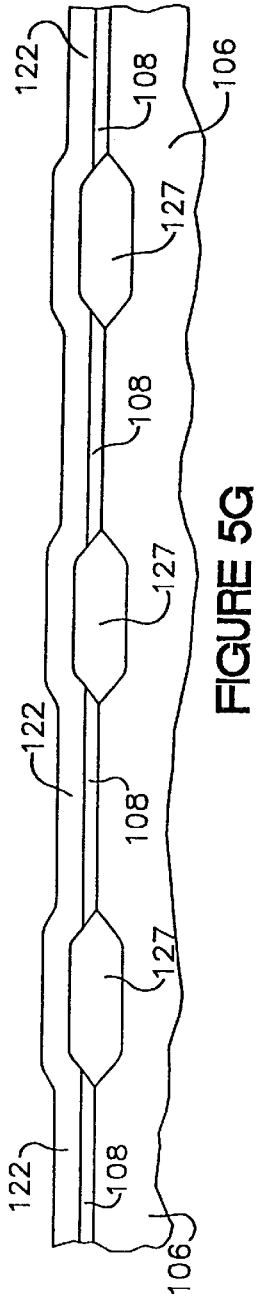

Step 120 also includes the deposition of a first polysilicon layer 122 over the surface of the device, as illustrated in FIG. 5d. The polysilicon layer 122 is then covered with a photoresist mask (not shown) at step 124 and etched to define a plurality of poly1 regions in the core region 105, wherein the regions comprise the floating gates for stacked gate flash memory cells and the first polysilicon layer for the source select transistor and drain select transistor, respectively, as illustrated in FIG. 5e. Note that in step 124, the polysilicon layer 122 is not etched between bit lines in the select gate transistor regions 24 and 26, as illustrated in FIG. 2b. Since FIG. 5e transversely cuts across the word lines, this lack of poly etching between the bit lines is not visible. Consequently, FIGS. 5f and 5g are provided which are cross sections of the core region 105 taken along dotted lines 5f–5f and 5g–5g in FIG. 5e, respectively.

Note that in select gate transistor regions of FIG. 5g, the poly region 122 is not etched between the bit lines 125 since this poly1 layer 122 is later used as an interconnect to short out the poly1 and poly2 layers (see also FIG. 3b).

A channel stop implant followed by a photoresist clean is then performed at step 126 to form an isolation implant doping region 129 under the field oxide 127. The channel stop implant serves to isolate the bit lines from one another in the memory cell region 22 of FIG. 2a in regions where the poly1 layer 122 was etched (that is, over the field oxide regions which are not shown). This channel stop implant, however, is not performed in the select gate regions 24 and 26 of FIG. 2a, because the poly1 layer 122 is not etched away, as illustrated in FIG. 5g. Consequently, the poly1 layer 122 shields the field oxide regions 127 from the channel stop implant which results in poor bit line to bit line isolation in the select gate transistor regions 24 and 26.

Figure 5H:
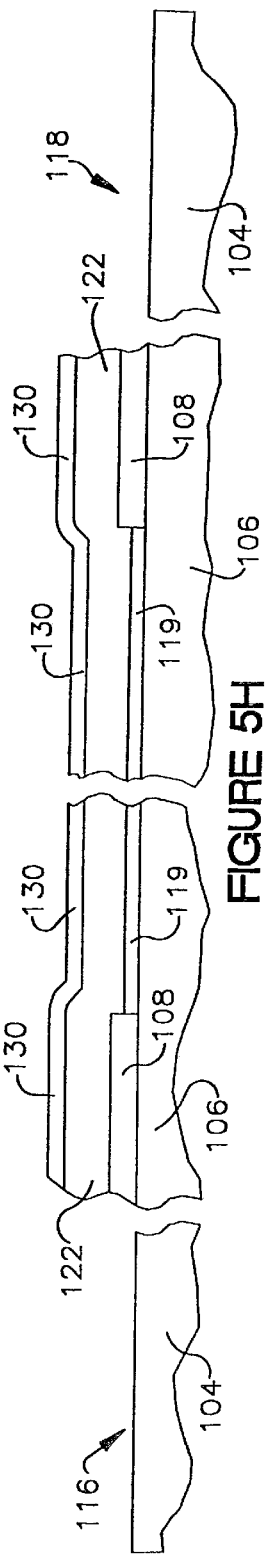

The process 100 continues at step 128 wherein an interpoly dielectric layer 130 is formed over the surface of the device and patterned to overlie the first polysilicon regions 122, as illustrated in FIG. 5h. The interpoly dielectric layer 130 often consists of an ONO layer which is an oxide/nitride/oxide layer formed via conventional processing techniques as is well known by those skilled in the art.

Figure 5I:
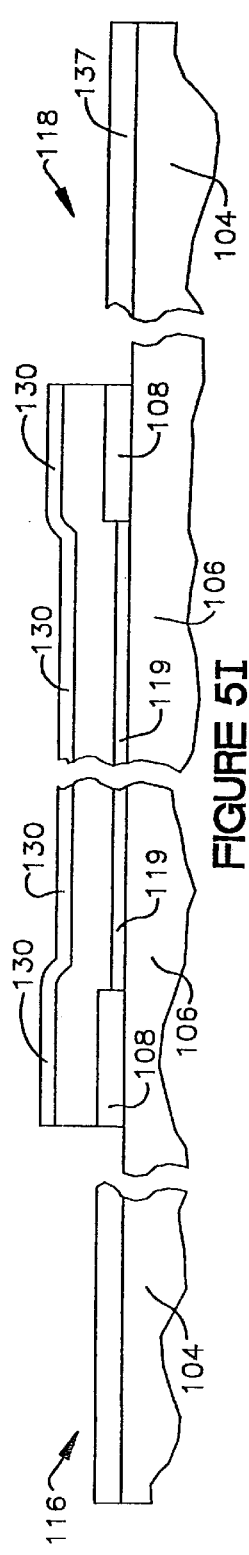

Following the ONO deposition and patterning at step 128, a pre-oxidation clean-up step is conducted followed by another oxidation of about 285 Å across the surface of the device at step 132. A channel threshold voltage mask is then formed at step 134 followed by an implant to adjust the threshold voltage at step 134. The peripheral gate oxide mask (GOX)(not shown) is then formed at step 136 which defines the opening for the thin gate oxide area of the low voltage peripheral transistor in the low voltage peripheral region 116. Step 136 includes the etching away of the oxide layer in the region 116 but not in the core region 105 since the oxide does not grow appreciably on the ONO layer, thereby leaving an intermediate oxide layer 137 remaining in the high voltage peripheral region 118, as illustrated in FIG. 5i. The etching is then followed by a photoresist clean to remove the GOX mask.

Figure 5J:
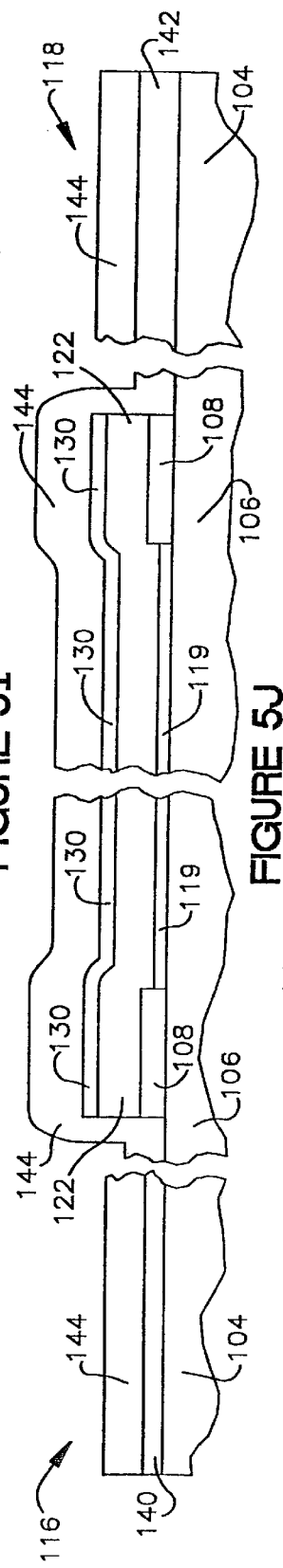

Once the GOX mask is removed, another oxidation step takes place at step 138, wherein a thin gate oxide 140 of about 160 Å is formed in the low voltage peripheral region 116 and a thick gate oxide 142 of about 400 Å continues to grow (from the intermediate oxide layer 137) in the high voltage peripheral region 118, as illustrated in FIG. 5j. Therefore steps 136 and 138 constitute the periphery dual oxide processing steps to form the periphery low voltage and high voltage transistor oxides, respectively. Step 138 also includes the deposition of a second polysilicon layer and a tungsten silicide layer which is collectively illustrated as a layer 144 in FIG. 5j.

Figure 5K:
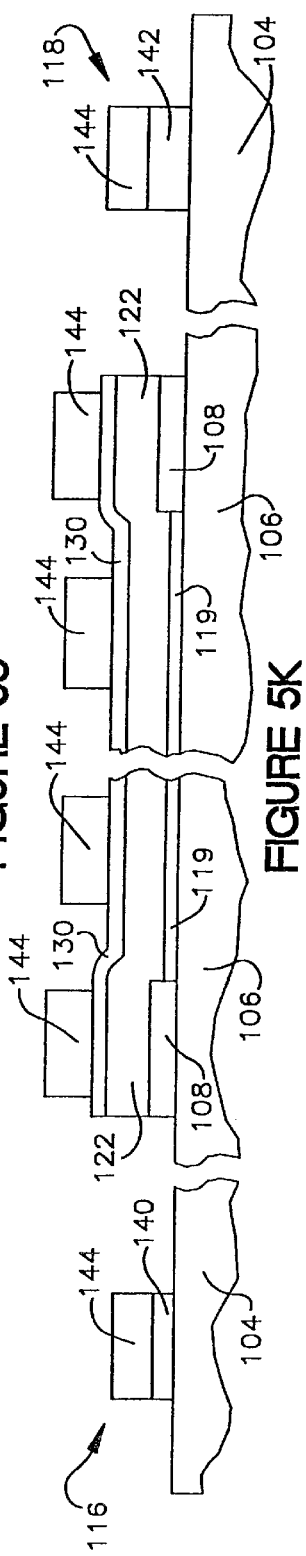
Figure 5L:
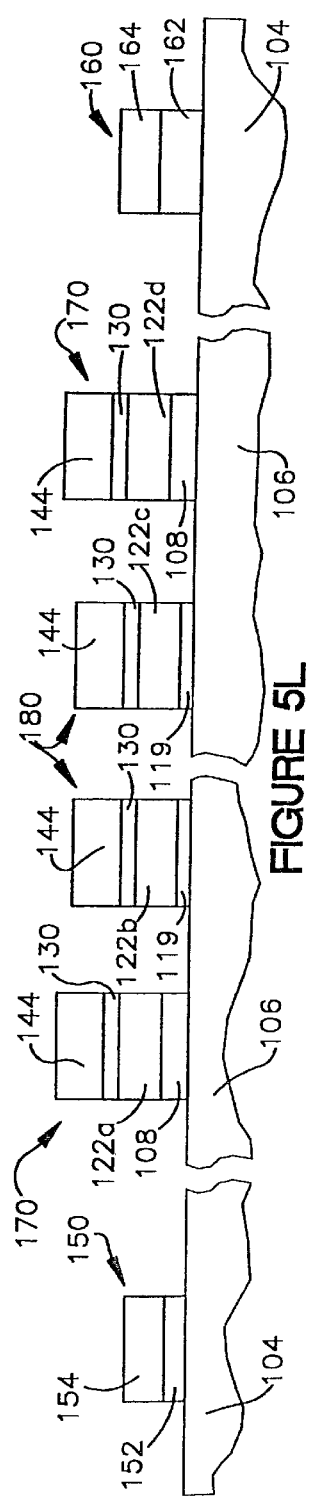

The process 100 continues at step 145, wherein a photoresist mask (not shown) is formed and patterned with openings to define the low and high voltage periphery transistors in the periphery regions 116 and 118, respectively, and the control gates for the stacked gate structures in the core region 105, as illustrated in FIG. 5k. The process 100 is then completed at step 146 (at least with respect to the formation of the four separate transistor structures illustrated in FIGS. 3a–3d. Step 146 includes the formation of a self-aligned mask (not shown) which defines openings in the core region 105 and the etching of the interpoly dielectric layer 130 and first polysilicon layer 122, respectively, as illustrated in FIG. 5l. The step 146 thereby results in a low voltage peripheral transistor 150 having a gate oxide 152 of about 160 Å and a poly2 gate region 154, and a high voltage peripheral transistor 160 having a gate oxide 162 of about 400 Å and poly2 gate 164. The etching of step 146 further defines the stacked gate structures that form the select gate transistors and the stacked gate/memory cells, respectively. The select gate transistors 170 (the select source and select drain transistors) each have a select gate oxide layer 108 of about 180 Å, a poly1 layer 122a and 122d, and an interpoly dielectric or ONO layer 130 and the poly2 layer 144. At a later stage in the process, the poly1 122a and 122d and poly two 144 are shorted together to achieve the select gate transistors as illustrated in FIG. 3b. The remaining stacked gate/memory cells 180 each have a tunnel oxide layer of about 95 Å, a floating gate layer 122, an interpoly dielectric or ONO layer 130 and a control gate layer 144.

The fabrication process discussed above in conjunction with FIGS. 2a–5l has several advantageous features, however, the process may be improved. First, the dual core oxide steps needed to produce the memory cells and select gate transistors having different oxide thicknesses in the core region is somewhat complicated and requires an additional mask, mainly the TOX mask discussed above, as well as the associated resist clean and oxide regrowth steps. In addition, poor tunnel oxide integrity may arise due to contamination during the TOX masking steps since a conventional HF dip can not be used to remove residual oxide. Furthermore, a channel stop implant can not be performed in the select gate transistor regions after the poly1 etch step as discussed above since the poly1 is used as an interconnect layer to short out the poly1 and poly2. The lack of a channel stop implant in the select gate transistor areas may result in bit line to bit line punch through. In addition, the spacing region between the first word line (WL1) and the select drain transistors 24a–24c of FIG. 2b may turn on when WL1 equals twenty (20) volts during programming which limits the memory device to operating at lower programming voltages, thereby resulting in a slower memory device. Furthermore, since the select gate structures require that the poly1 and poly2 layers be shorted together, a special poly1 contact process is later required to effectuate that short circuit. Lastly, the poly1 contact increases the size of each select gate transistor which adversely affects the die size of the flash memory device.

Figure 6A:
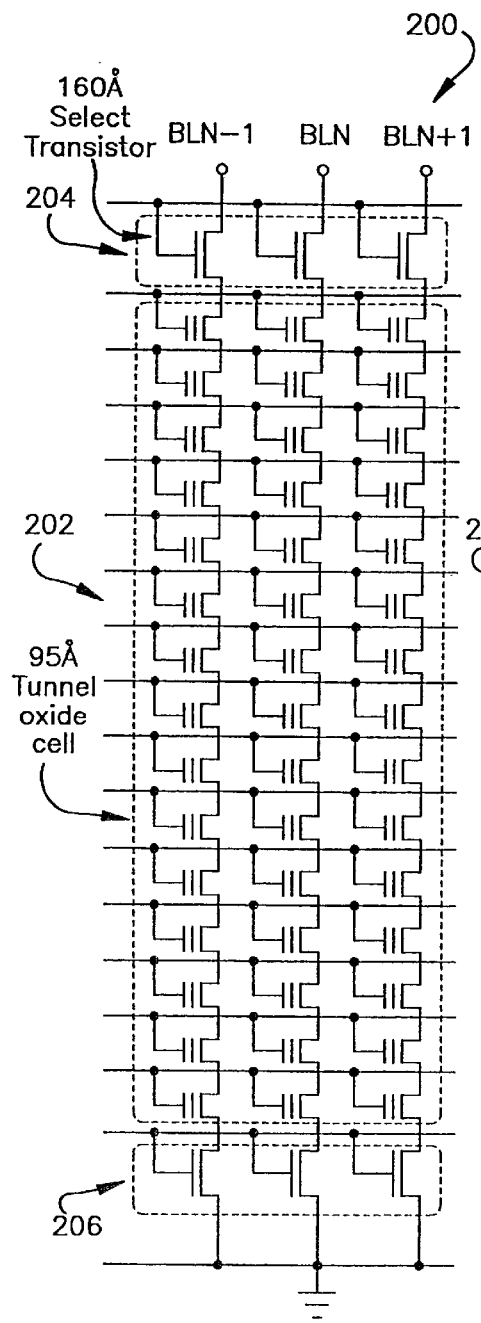
FIG. 6a is a schematic diagram illustrating a core portion of a NAND-type flash memory device according to the present invention.
Figure 6B:
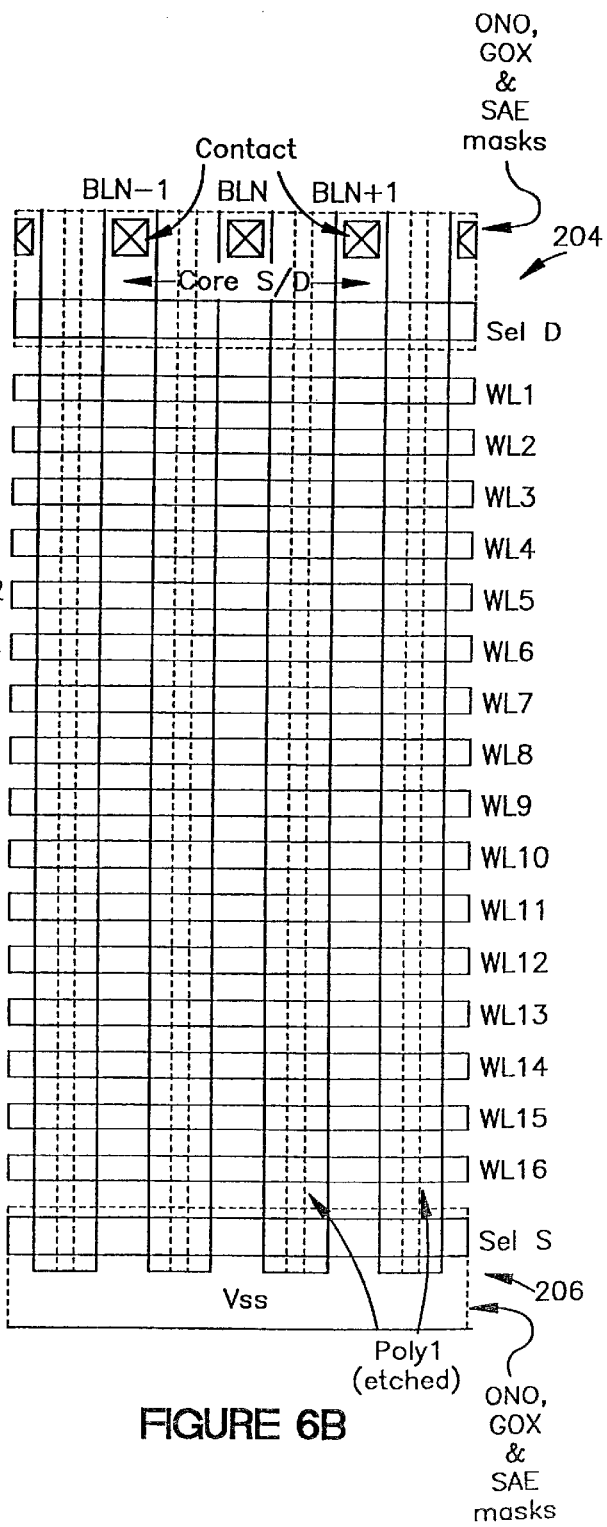
FIG. 6b is a plan layout view of the NAND-type flash memory device of FIG. 6a according to the present invention.

A circuit schematic of a NAND-type flash memory device and a corresponding plan view layout diagram according to one embodiment of the present invention is illustrated in FIGS. 6a and 6b, respectively. A core portion 200 of the flash memory device includes a core memory cell portion 202 which is similar to the memory cell portion 22 of FIG. 2a. The core memory cell portion 202 is bounded on one side by a drain select gate transistor region 204 and on another side by a source select gate transistor region 206. The select gate transistor regions 204 and 206 differ from the select gate transistors 24 and 26 in that the select gate transistors within the regions 204 and 206 of the present invention are not stacked gate structures (which required the shorting of the poly1 and poly2 layers). Furthermore, since the select gate transistor regions 204 and 206 are not stacked gate structures, but instead are like the periphery, low voltage transistors, the core dual oxide fabrication steps required to form the stacked gate structures of FIGS. 3a and 3b having differing oxide thicknesses is eliminated, thereby simplifying the semiconductor processing.

Figure 7A:
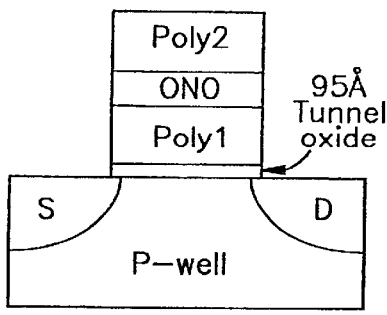
FIG. 7a is a cross section of a stacked gate flash memory cell in the core region according to the present invention.
Figure 7B:
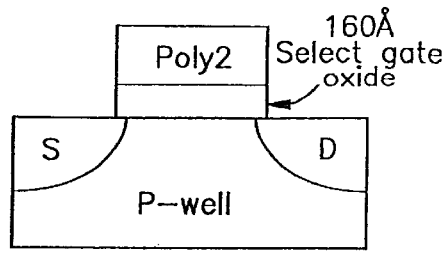
FIG. 7b is a cross section of a select gate transistor in the core region according to the present invention.
Figure 7C:
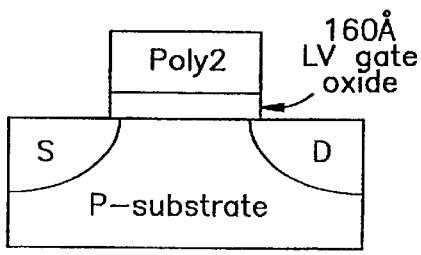
FIG. 7c is a cross section of a periphery low voltage transistor according to the present invention.
Figure 7D:
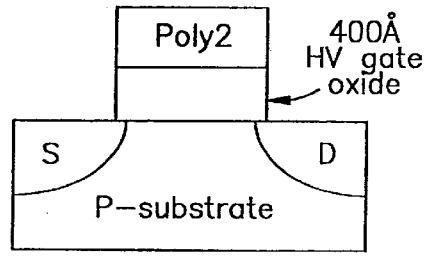
FIG. 7d is a cross section of a periphery high voltage transistor according to the present invention.
Figure 8:
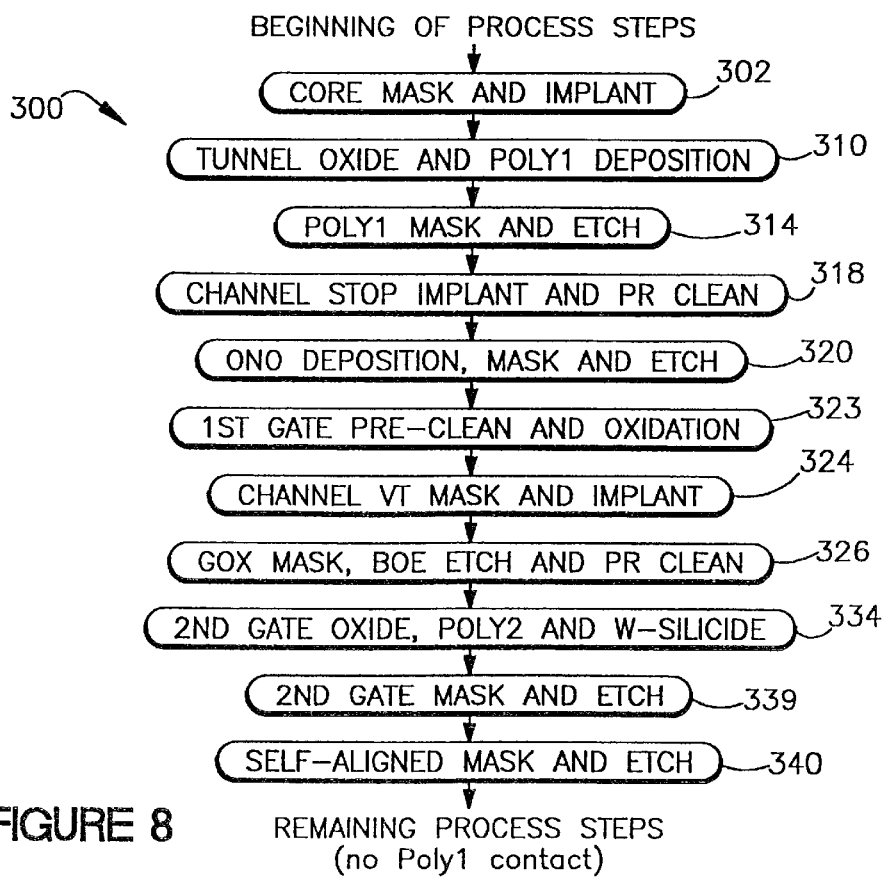
FIG. 8 is a flow chart diagram illustrating a semiconductor manufacturing process flow for forming the NAND-type flash memory device of FIGS. 6a and 6b according to the present invention.

In a preferred embodiment of the present invention, the poly2/silicide layer used to form the gate regions of the periphery high and low voltage transistors is used to replace the poly1/ONO/poly2 stacked gate structure of FIG. 3b for the core select source and select drain transistors in the regions 204 and 206. Therefore the process steps and masks used to form the periphery low voltage transistors may also be used to form the core select gate transistors. Therefore, instead of the process resulting in four transistor structures requiring two separate dual oxide fabrication process steps, only three transistor structures are fabricated, as illustrated in FIGS. 7a–7d (since the structures of FIGS. 7b and 7c are substantially the same), thereby eliminating one set of dual oxide processing steps in forming the thin core tunnel oxide and substantially eliminating sensitive tunnel oxide contamination associated with the core dual oxide process.

The structural differences between the present invention and other structures may further be seen in a comparison of the plan layout view of the present invention of FIG. 6b with FIG. 2b. Note that in FIG. 6b, the first layer of polysilicon (poly1) is etched between the bit lines (BLN-1, BLN, BLN+1) in both the core memory region 202 and the select gate transistor regions 204 and 206. In addition, the ONO and GOX masks (which will be described in greater detail supra) effectively prohibit ONO deposition and double oxide layer formation in the select gate transistor regions 204 and 206, thereby resulting in select gate transistors having poly2 as the gate material, as illustrated in FIG. 7b. Conversely, in FIG. 2b, the etching of the poly1 does not extend through the select gate transistor regions 24 and 26, thereby resulting in double poly, stacked gate structures, as illustrated in FIG. 3b.

In addition to the above advantages, the removal of the poly1 layer between the bit lines in the select gate transistor regions 204 and 206 allows the regions 204 and 206 to receive a channel stop implant which results in significantly improved bit line isolation and word line field turn-on. The substantial improvement in bit isolation allows for higher programming voltages which provide for higher speed programming functionality and the potential for use of the structure in multi-level NAND-type devices. In addition to the above features, the poly2 gate region, which may be composed of a poly/tungsten silicide combination, may be used as an interconnect for the select gate transistors, thereby further improving their performance.

In the preferred embodiment of the present invention, the semiconductor processing steps used to form the periphery, low voltage transistor structures are also used to form the core select gate transistors, thereby making the structures substantially the same. A method of forming a NAND type flash memory device according to the preferred embodiment of the present invention will now be described in conjunction with a semiconductor manufacturing flow chart in FIG. 8 and FIGS. 9a–9h.

The process 300 begins with a core mask and implant step 302 wherein a photoresist mask 303 is formed and patterned over a P-well which resides in an N-well in the P-substrate 304 to define an opening over a core region 305. The core region 305 is then subjected to a P-type impurity dopant via, for example, ion implantation to thereby form a highly doped channel region 306 in the P-well of the core region 305, as illustrated in FIG. 9a.

The photoresist mask 303 is then removed and a tunnel oxide 308 having a thickness of about 95 Å is grown over the surface of the device at step 310. The oxide layer is grown, for example, in a dry oxidation furnace.

Step 310 also includes the deposition of a first polysilicon layer 312 over the surface of the device, as illustrated in FIG. 9b. The polysilicon layer 312 is then covered with a photoresist mask 315 at step 314 and etched to define a plurality of poly1 regions 316a and 316b, wherein the regions 316a and 316b comprise the floating gates for the stacked gate flash memory cells and select transistors in the core region 305, as illustrated in FIG. 9c.

A channel stop implant is then performed at step 318. Since the cross section diagram of FIG. 9c is oriented to cut transversely across the word lines, the channel stop implant (which helps isolate the bit lines) is not illustrated in the Figure. FIG. 9d, however, illustrates the core portion 305 of FIG. 9c taken along dotted line 9d–9d so that the cross section transversely cuts across the bit lines. FIG. 9d illustrates how the absence of poly1 between the bit lines in the select gate transistor regions allows the channel stop implant in the region 319 to be formed.

The channel stop implant uses the poly1 etch photomask 315 of step 314 to define the regions 319 that receive the implant, as illustrated in FIG. 9d. Step 318 then concludes with a photoresist clean step to remove the photomask 315 which was used for the poly1 etch and the channel stop implant.

The present invention provides an improvement to the above described structure and method since the poly1 layer between the bit lines (BLN−1, BLN, BLN+1) is etched away in the select gate regions 204 and 206, as illustrated in FIG. 6b. Etching away the polysilicon between the bit lines in the regions 204 and 206 allows the channel stop implant to be performed in the regions 204 and 206, which thereby decreases the potential for bit line to bit line punch through or leakage in the select gate regions 204 and 206, respectively. The channel stop implant region 319 of step 318 provides good bit line to bit line isolation which allows the device to operate at a wider range of program voltages.

Figure 9E:
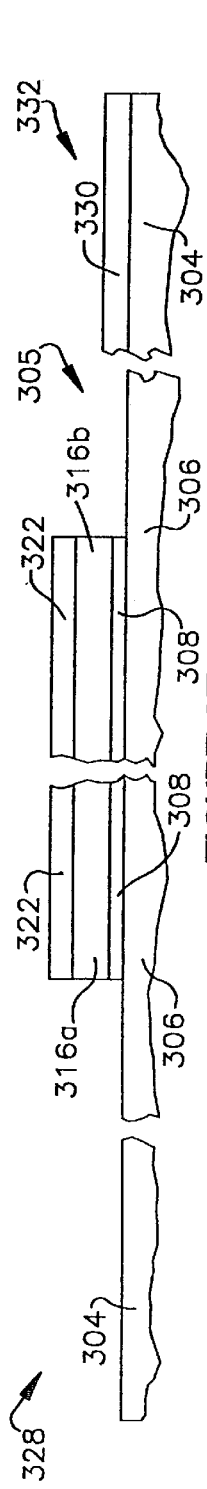

The process 300 continues at step 320 wherein an interpoly dielectric layer 322 is formed over the surface of the device and patterned to overlie the poly1 floating gate regions 316a and 316b, respectively, as illustrated in FIG. 9e. The interpoly dielectric layer 320 often consists of an ONO layer which is an oxide/nitride/oxide layer formed via conventional processing techniques as is well known by those skilled in the art. Note that in FIG. 9e the patterning of the interpoly dielectric layer 322 etches away the layer 322 and the first polysilicon layer 312 in the periphery areas as well as in the select transistor areas within the core region 305.

Following the ONO deposition and patterning at step 320, a pre-oxidation clean-up step is conducted followed by the formation of an oxide layer across the surface of the device at step 323. A channel threshold voltage mask is then formed (not shown) followed by an implant to adjust the threshold voltage for the periphery devices at step 324. A peripheral gate oxide mask (GOX)(not shown) is then formed at step 326 which defines an opening for the thin gate oxide area for the low voltage peripheral transistor in the low voltage peripheral region 320 and the gate oxide for the select gate transistors in the core region 305. Step 326 includes the etching away of the oxide layer in the region 328 as well as in the select transistor areas within the core region 305 using the GOX mask as shown in FIG. 6b, thereby leaving an intermediate oxide layer 330 remaining in the high voltage peripheral region 332, as illustrated in FIG. 9e. The etching is then followed by a photoresist clean to remove the GOX mask.

Figure 9F:
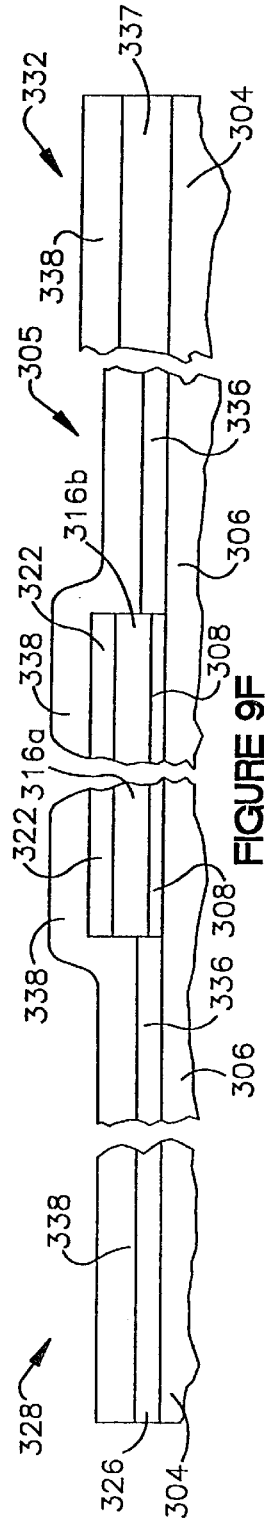

Once the GOX mask is removed, another oxidation step takes place at step 334, wherein a thin gate oxide 336 of about 160 Å is formed in the low voltage peripheral region 328 and the core region 305 to form the gate oxide for the select gate transistors while a thick gate oxide 337 of about 400 Å continues to grow (from the intermediate oxide layer 330) in the high voltage peripheral region 332, as illustrated in FIG. 9f. Therefore steps 326 and 334 constitute the periphery dual oxide processing steps to form the periphery low voltage and select gate transistor oxides and the high voltage transistor oxides, respectively. Step 324 also includes the deposition of a second polysilicon layer and a tungsten silicide layer which is collectively illustrated as a layer 338 in FIG. 9f.

Figure 9G:
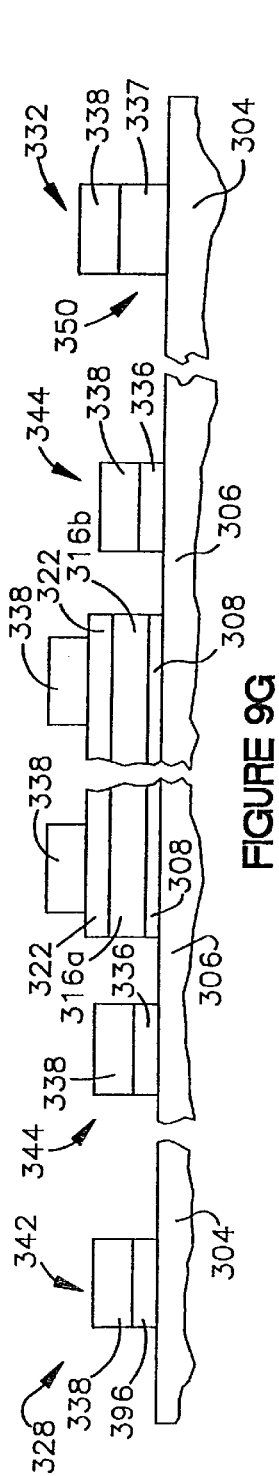
Figure 9H:
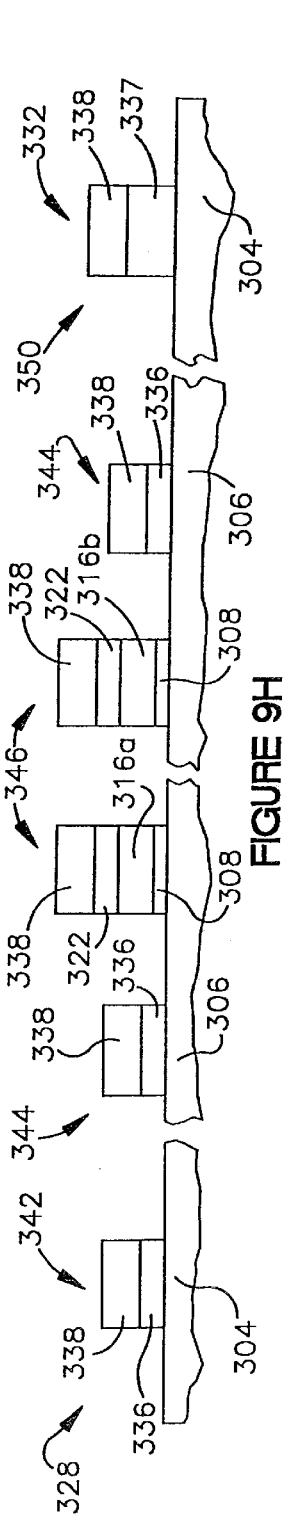

The process 300 then continues at step 339, wherein a photoresist mask (not shown) is formed and patterned with openings to define the low and high voltage periphery transistors in the periphery regions 328 and 332, respectively, the select gate transistors and the control gate structures for the stacked gate devices in the core region 305, as illustrated in FIG. 9g. The process 300 is then completed at step 340 (at least with respect to the formation of the three separate transistor structures illustrated in FIGS. 7a–7d. Step 340 includes the formation of a self-aligned mask (not shown) and the etching of selective portions of the interpoly dielectric layer 322 and the first polysilicon layers 316a and 316b, as illustrated in FIG. 9h. During the self-aligned etch process, the select transistor areas are covered by the SAE mask to avoid potential polysilicon gouging in the region. The step 339 thereby results in a low voltage peripheral transistor 342 and select gate transistors 344 having a gate oxide 336 of about 160 Å and a poly2 gate region 338, and a high voltage peripheral transistor 350 having a gate oxide 337 of about 400 Å and a poly2 gate 338. The etching of step 340 defines the stacked gate structures using the layer 338 as a self-aligned mask that form the stacked gate/memory cells 346, respectively.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application.

What is claimed is:

1. A method of forming a NAND-type flash memory device, comprising the steps of:

forming a floating gate region over a tunnel oxide layer on a core region of a substrate;

forming an insulating layer over the floating gate region;

performing a periphery dual oxide process, thereby forming an oxide region having a first thickness in a high voltage periphery region and an oxide region having a second thickness in both a low voltage periphery region and in a select gate transistor region in the core region, wherein the first thickness is greater than the second thickness;

forming a conductive layer over a surface of the device; and patterning the conductive layer to form a gate over the oxide region in the low voltage periphery region and in the select gate transistor region, respectively, to thereby form a low voltage periphery transistor and a select gate transistor, and form a gate over the oxide region in the high voltage periphery region and thereby form a high voltage periphery transistor and form a control gate over the insulating layer to thereby form a stacked gate flash memory cell in the core region.

2. The method of claim 1, wherein forming a floating gate region over a tunnel oxide layer on a core region of the substrate comprises the steps of:

forming the tunnel oxide layer over the substrate;

forming a conductive layer over the tunnel oxide layer; and patterning the conductive layer and tunnel oxide layer to form a layered structure in the core region of the substrate, wherein the conductive layer comprises the floating gate region.

3. The method of claim 1, wherein forming the insulating layer comprises the steps of:

depositing a first oxide layer;

depositing a nitride layer over the first oxide layer; and depositing a second oxide layer over the nitride layer.

4. The method of claim 1, wherein performing a peripheral dual oxide process comprises the steps of:

forming an oxide layer over a surface of the device;

forming and patterning a mask over the oxide layer, thereby forming a plurality of openings in the mask that define a plurality of regions wherein an oxide region having the second thickness will be formed;

etching the oxide layer, thereby removing the oxide layer in regions defined by the openings in the mask;

removing the mask; and forming another oxide layer over the surface of the device, wherein a region previously covered by the mask has the first thickness and the plurality of regions previously etched have the second thickness.

5. The method of claim 1, wherein the step of forming the conductive layer comprises the steps of:

depositing a polycrystalline silicon layer;

doping the polycrystalline silicon layer with impurity ions; and depositing a tungsten silicide layer over the polycrystalline silicon layer.

6. The method of claim 1, further comprising the step of performing a channel stop implant in the select gate transistor region.

7. The method of claim 6, wherein the channel stop implant step uses a mask used to form the floating gate region, thereby providing isolation between one or more bit lines.

8. The method of claim 1, further comprising a threshold voltage adjust implant during the dual oxide process.

9. A method of claim 1, wherein patterning the conductive layer comprises the steps of forming a second gate mask, performing a second gate etch and a self-aligned etch, thereby forming the low voltage and high voltage periphery transistors and the select gate transistor and forming a plurality of stacked gate structures that share the conductive layer to thereby form a word line.

* * * * *